(12) United States Patent
Liu et al.

(10) Patent No.: US 10,825,925 B2
(45) Date of Patent: *Nov. 3, 2020

(54) FABRICATING METHOD OF TRANSISTOR STRUCTURE

(71) Applicant: United Semiconductor (Xiamen) Co., Ltd., Xiamen, Fujian (CN)

(72) Inventors: Sheng-Hsu Liu, Changhua County (TW); Shih-Hsien Huang, Kaohsiung (TW); Wen Yi Tan, Fujian (CN)

(73) Assignee: United Semiconductor (Xiamen) Co., Ltd., Xiamen, Fujian (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/736,823

(22) Filed: Jan. 8, 2020

(65) Prior Publication Data

US 2020/0212216 A1 Jul. 2, 2020

Related U.S. Application Data

(63) Continuation of application No. 16/260,136, filed on Jan. 29, 2019, now Pat. No. 10,573,737.

(30) Foreign Application Priority Data

Dec. 27, 2018 (CN) .......................... 2018 1 1609713

(51) Int. Cl.
*H01L 21/336* (2006.01)
*H01L 29/78* (2006.01)
*H01L 29/16* (2006.01)
*H01L 29/165* (2006.01)
*H01L 21/306* (2006.01)
(Continued)

(52) U.S. Cl.
CPC ........ *H01L 29/78* (2013.01); *H01L 21/02529* (2013.01); *H01L 21/02532* (2013.01); *H01L 21/306* (2013.01); *H01L 29/165* (2013.01); *H01L 29/1608* (2013.01); *H01L 29/6656* (2013.01)

(58) Field of Classification Search
CPC ......... H01L 21/02529; H01L 21/02532; H01L 21/306
See application file for complete search history.

(56) References Cited

U.S. PATENT DOCUMENTS

2012/0058616 A1 3/2012 Ahn
2012/0234203 A1 9/2012 Kempen
2016/0181383 A1* 6/2016 Huang .............. H01L 29/41758
257/757

* cited by examiner

*Primary Examiner* — Samuel A Gebremariam
(74) *Attorney, Agent, or Firm* — Winston Hsu

(57) ABSTRACT

A fabricating method of a transistor structure includes providing a substrate with a doped well disposed within the substrate. Later, a gate structure is formed to be disposed on the doped well. Next, a hexagonal-shaped trench is formed to be embedded in the doped well at one side of the gate structure. Subsequently, a first epitaxial layer is formed to be disposed inside the hexagonal-shaped trench and contact the hexagonal-shaped trench, wherein the first epitaxial layer includes first type dopants. Finally, a second epitaxial layer including second-type dopants is formed to be disposed in the hexagon-shaped trench, wherein the first epitaxial layer surrounds the second epitaxial layer, the second epitaxial layer serves as a source/drain doped region of the transistor structure, and the first-type dopants and the second-type dopants are different conductive types.

15 Claims, 4 Drawing Sheets

(51) Int. Cl.
*H01L 21/02* (2006.01)
*H01L 29/66* (2006.01)

FABRICATING METHOD OF TRANSISTOR STRUCTURE

CROSS REFERENCE TO RELATED APPLICATIONS

This patent application is a continuation application of and claims priority to U.S. patent application Ser. No. 16/260,136, filed on Jan. 29, 2019, and entitled "TRANSISTOR STRUCTURE" the entire contents of which are incorporated herein by reference.

BACKGROUND OF THE INVENTION

1. Field of the Invention

The present invention relates to a transistor structure and a method of fabricating the same, and more particularly, to a transistor structure which uses epitaxial layers to prevent a short channel effect and a method of fabricating the transistor.

2. Description of the Prior Art

Industry demands require IC circuits with higher densities, leading to the down-scaling of MOS transistors. As the channel length in MOS transistors is reduced to increase speed, a short channel effect often occurs. The short channel effect is an undesirable increase in the threshold voltage of the gate as the channel length is reduced, which severely degrades the device characteristics.

Therefore, there is a need for a method and structure which overcomes the short channel effect and allows MOS transistors to produce consistent threshold voltages.

SUMMARY OF THE INVENTION

It is therefore an object of the present invention to provide a structure and method for controlling short-channel effects.

According to a preferred embodiment of the present invention, a fabricating method of a transistor structure includes providing a substrate with a doped well disposed within the substrate. Later, a gate structure is formed to be disposed on the doped well. Next, a hexagonal-shaped trench is formed to be embedded in the doped well at one side of the gate structure. Subsequently, a first epitaxial layer is formed to be disposed inside the hexagonal-shaped trench and contact the hexagonal-shaped trench, wherein the first epitaxial layer includes first type dopants. Finally, a second epitaxial layer including second-type dopants is formed to be disposed in the hexagon-shaped trench, wherein the first epitaxial layer surrounds the second epitaxial layer, the second epitaxial layer serves as a source/drain doped region of the transistor structure, and the first-type dopants and the second-type dopants are different conductive types.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 depict a fabricating method of a transistor structure according to a preferred embodiment of the present invention, wherein:

FIG. 1 depicts a substrate having a gate structure and a trench thereon;
FIG. 2 depicts a fabricating stage following FIG. 1;
FIG. 3 depicts a fabricating stage following FIG. 2; and
FIG. 4 depicts a fabricating stage following FIG. 3.

DETAILED DESCRIPTION

Figure 1:
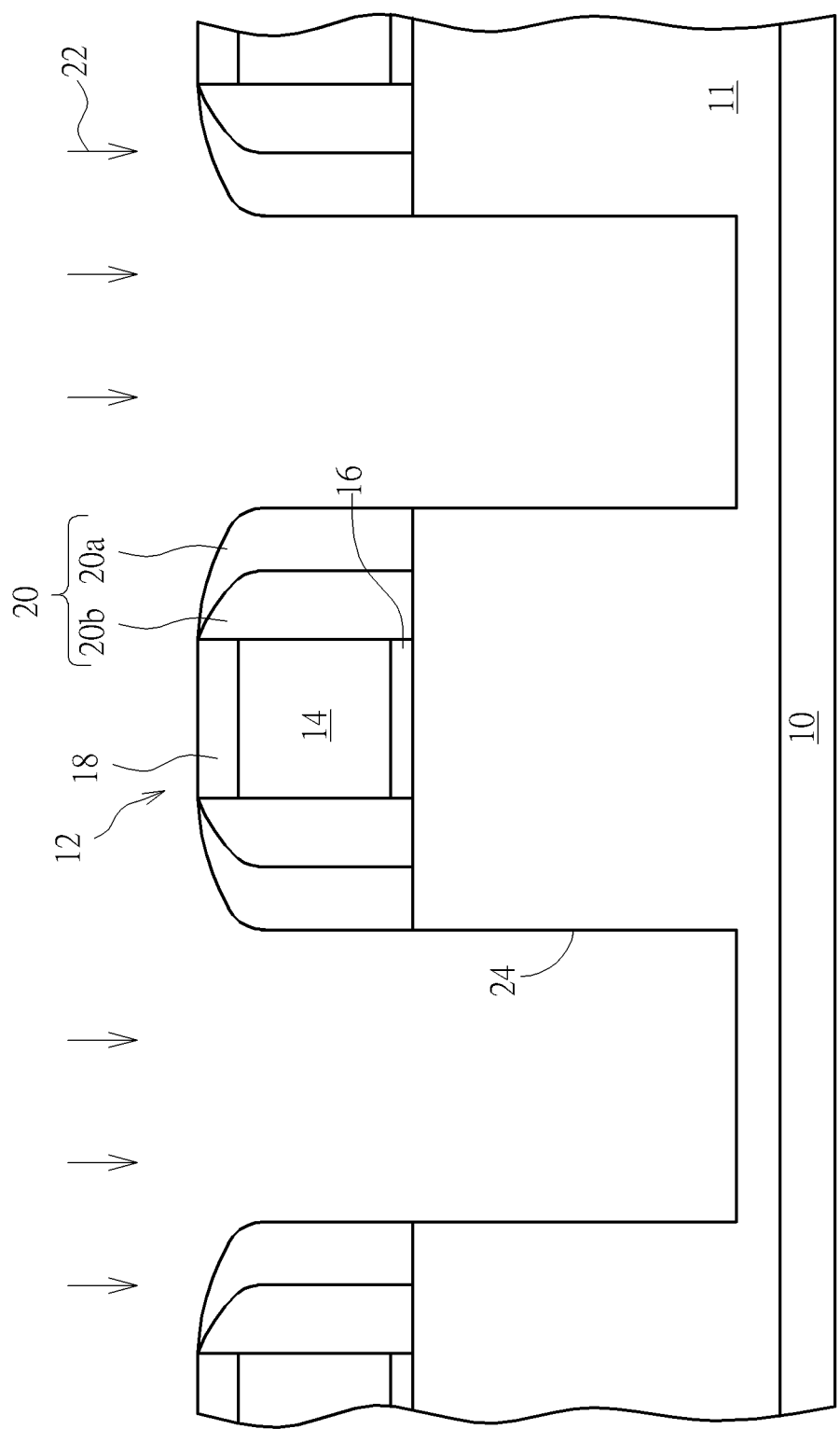

FIG. 1 to FIG. 4 depict a fabricating method of a transistor structure according to a preferred embodiment of the present invention. As shown in FIG. 1, a substrate 10 is provided. A doped well 11 is disposed in the substrate 10. The doped well 11 includes first-type dopants. A gate structure 12 is disposed on the doped well 11. The gate structure 12 includes a gate electrode 14 and a gate dielectric layer 16. The gate dielectric layer 16 is disposed between the gate electrode 14 and the substrate 10. The gate electrode 14 may include one or multiple conductive material layers such as polysilicon, aluminum, tungsten, or titanium. The gate dielectric layer 16 may include one or multiple insulating layers such as silicon oxide or high-k dielectrics. A cap 18 is disposed on the gate electrode 14.

Two spacer structures 20 are respectively disposed at two sides of the gate structure 12. Each of the spacer structures 20 may be formed by a single spacer or multiple-layered spacer. According to one embodiment of the present invention, each spacer structure 20 includes a spacer 20a and a spacer 20b. The spacer structures 20 and the cap 18 may include silicon oxide, silicon nitride, silicon carbon nitride, silicon oxynitride or silicon carbon oxynitride. Next, an anisotropic etch process 22 such as a dry etching is performed to form a trench 24 at two sides of the gate structure 12 in the substrate 10 by taking the cap 18 and the spacer structures 20 as a mask. There are two trenches 24 shown in the present invention as an example. The trenches 24 are both U-shaped.

Figure 2:
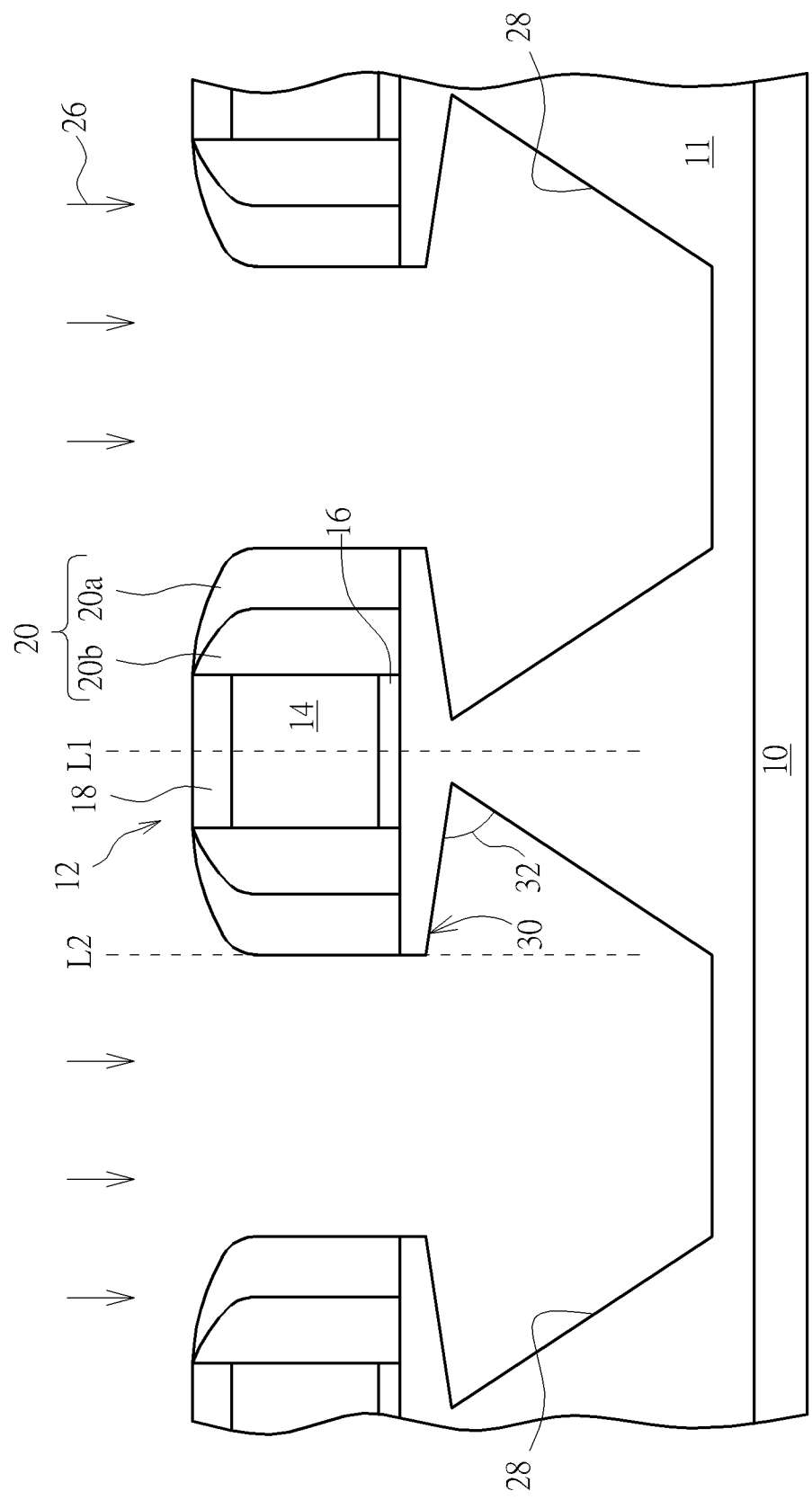

As shown in FIG. 2, an isotropic etch process 22 such as a wet etch is performed to etch the trenches 24 to transform them into two hexagonal-shaped trenches 28. Each of the hexagonal-shaped trenches 28 has an inclined surface 30 and a Miller index of the inclined surface 30 is (111). An etchant of the wet etching can be ammonia or potassium hydroxide. According to another preferred embodiment of the present invention, the Miller index of the inclined surface 30 can be adjusted by changing the etchant types or altering concentration of the etchant. Moreover, each of the hexagonal-shaped trenches 28 has a tip 32 below the gate structure 12. The gate structure 12 has a vertical symmetrical axis L1. An extension line L2 is defined by extending the surface of one spacer structure 20 in a perpendicular direction to the top surface of the substrate 10. The position of the tip 32 can be changed by altering the etchant types or concentration of the etchant. In detail, the position of the tip 32 can move between the vertical symmetrical axis L1 and the extension line L2 based on different requirements. Furthermore, the tip 32 preferably overlaps the gate structure 12.

Figure 3:
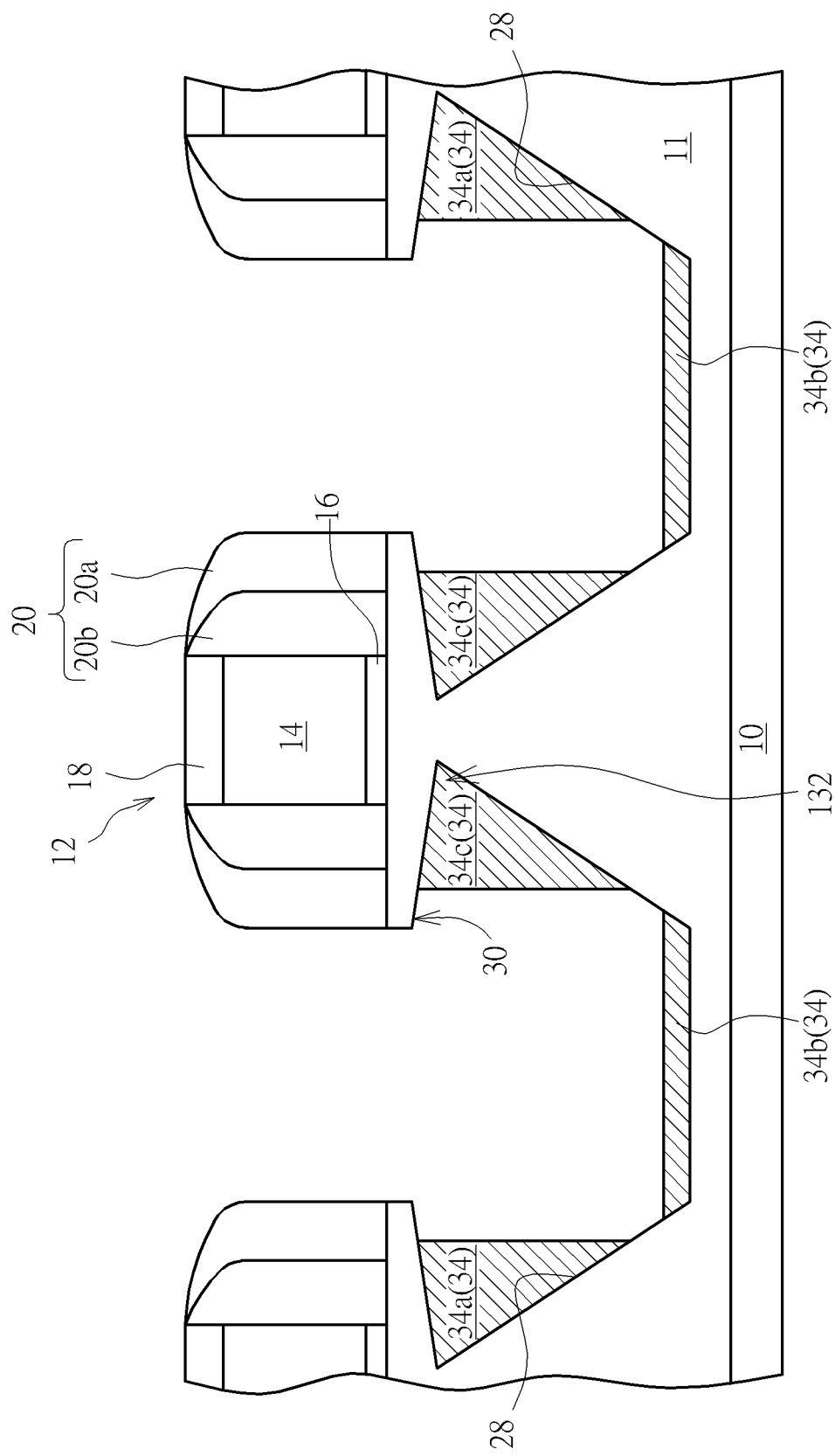
Figure 4:
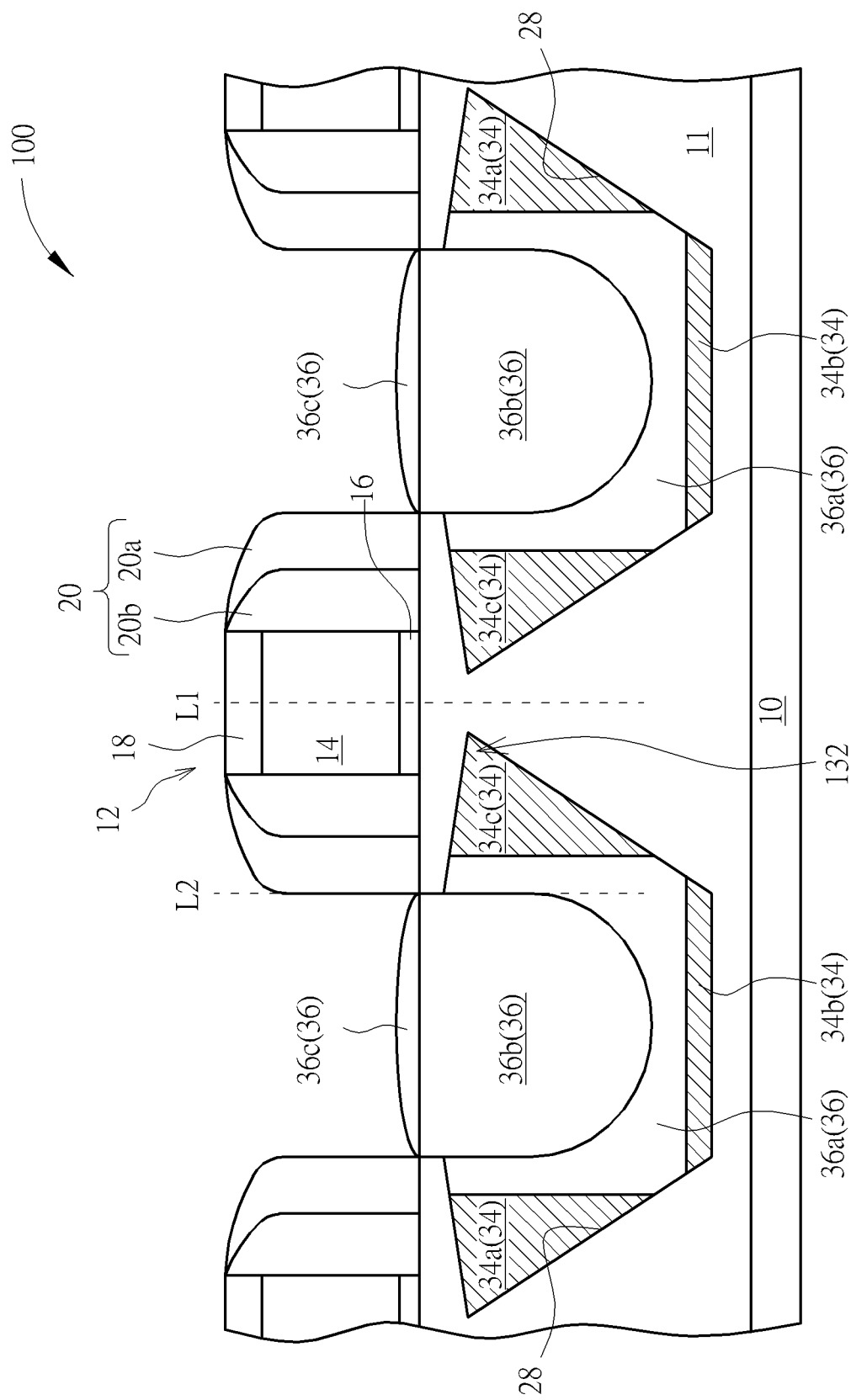

As shown in FIG. 3, a first epitaxial layer 34 is formed in each of the hexagonal-shaped trenches 28. The first epitaxial layer 34 includes first-type dopants and contacts the hexagonal-shaped trenches 28. The first-type dopants are introduced into the first epitaxial layer 34 by an in-situ process during forming the first epitaxial layer 34. The formation of the first epitaxial layer 34 and the step of introducing the first-type dopants into the first epitaxial layer 34 are performed in the same chamber. The in-situ process of the first-type dopants in the first epitaxial layer 34 is not performed after the substrate 10 is moved out of the chamber of forming the first epitaxial layer 34. A concentration of the first-type dopants in the first epitaxial layer 34 is greater than a concentration of the first-type dopants in the doped well 11. Next, as shown in FIG. 4, a second epitaxial layer 36 is formed in each of the hexagonal-shaped trenches 28. The first epitaxial layer 34 is outside of the second epitaxial layer 36. In detail, the first epitaxial layer 34 includes three epitaxial pieces 34a/34b/34c. The epitaxial pieces 34a/34b/34c do not connect to each other. The epitaxial pieces 34a/34b/34c are respectively disposed at a bottom, a right side and a left side of the second epitaxial layer 36. The second epitaxial layer 36 includes second-type dopants. The second-type dopants and the first-type dopants are of different conductive types. For example, the first-type dopants are P-type, and the second-type dopants are N-type or vice versa. Moreover, there are no second-type dopants within the first epitaxial layer 36. The second-type dopants are introduced into the second epitaxial layer 36 by an in-situ process. The first epitaxial layer 34 and the second epitaxial layer 36 are formed in the same chamber. Therefore, the in-situ process of the second-type dopants in the second epitaxial layer 36 is not performed after moving the substrate 10 out of the chamber of forming the second epitaxial layer 36. The second epitaxial layer 36 includes several epitaxial layers such as a barrier layer 36a, a stress layer 36b and a cap layer 36c. The barrier layer 36a contacts the first epitaxial layer 34. The stress layer 36b is surrounded by the barrier layer 36a. The cap layer 36c is disposed on the stress layer 36b and is higher than the top surface of the substrate 10. At this point, a transistor structure 100 of the present invention is completed.

As shown in FIG. 4, a transistor structure 100 includes a substrate 10. A doped well 11 is disposed in the doped well 11. The doped well 11 includes first-type dopants. A gate structure 12 is disposed on the doped well 11 and also on the substrate 10. The gate structure 12 includes a gate electrode 14 and a gate dielectric layer 16. The gate structure 12 is disposed between the gate electrode 14 and the substrate 10. A spacer structure 20 is disposed at one side of the gate structure 12. A hexagonal-shaped trench 28 is disposed in the substrate 10 at one side of the gate structure 12. A first epitaxial layer 34 is disposed in the hexagonal-shaped trench 28 and contacts the hexagonal-shaped trench 28. The first epitaxial layer 34 includes first-type dopants. A second epitaxial layer 36 is disposed in the hexagonal-shaped trench 28. The second epitaxial layer 36 includes second-type dopants. The first epitaxial layer 34 is outside of the second epitaxial layer 36. The second epitaxial layer 36 serves as a source/drain doped region of the transistor structure 100. It is noteworthy that the first-type dopants and the second-type dopants are different conductive types. The first epitaxial layer 34 does not include any second-type dopants. The concentration of the first-type dopants is preferably between 1E16 and 1E21 atoms/cm³.

In detail, the first epitaxial layer 34 includes three epitaxial pieces 34a/34b/34c. The epitaxial pieces 34a/34b/34c do not connect to each other. The epitaxial pieces 34a/34b/34c are respectively disposed at a bottom, a right side and a left side of the second epitaxial layer 36.

The first epitaxial layer 34 has a tip 132 below the gate structure 12. The location of the tip 132 overlaps the location of the tip 32 of the hexagonal-shaped trench 28. The tip 132 can be moved between the extension line L2 and the vertical symmetrical axis L1 based on different requirements. Moreover, the tip 132 preferably overlaps the gate structure 12. In other words, part of the first epitaxial layer 34 overlaps the gate structure 12. The second epitaxial layer 36 includes several epitaxial layers such as a barrier layer 36a, a stress layer 36b and a cap layer 36c. The barrier layer 36a contacts the first epitaxial layer 36. The stress layer 36b is surrounded by the barrier layer 36a. The cap layer 36c is disposed on the stress layer 36b and higher than the top surface of the substrate 10. Part of the barrier layer 36a overlaps the spacer structure 20. Moreover, the barrier layer 36a, the stress layer 36b and the cap layer 36c have the same stress type, but may have different stresses. According to a preferred embodiment of the present invention, the stress of the stress layer 36b is larger than the stress of the barrier layer 36a. The stress of the barrier layer 36a is larger than the stress of the cap layer 36c. There is no stress in the first epitaxial layer 34.

The concentrations of the second-type dopants in the barrier layer 36a, the stress layer 36b and the cap layer 36c are different. In detail, the concentration of the second-type dopants in the stress layer 36b is greater than the concentrations of second-type dopants in barrier layer 36a and in the cap layer 36c. The concentration of second-type dopants in barrier layer 36a is greater than the cap layer 36c. There are no dopants in the barrier layer 36a. According to different requirements, however, the barrier layer 36a can have second-type dopants within. The stress layer 36b and the cap layer 36c both have second-type dopants within.

If the transistor structure 100 is a P-type transistor structure, the second-type dopants include B, In, or Ga, and the first type dopants include P, As, or Sb. The first epitaxial layer 34 is epitaxial silicon, and the second epitaxial layer 36 is SiGe or epitaxial silicon. For example, when the transistor structure 100 is a P-type transistor structure, the first epitaxial layer 34 is epitaxial silicon doped with P. The barrier layer 36a is SiGe doped with B. The stress layer 36b can be SiGe doped with B. The cap layer 36c is epitaxial silicon doped with B.

When the transistor structure 100 is an N-type transistor, the second-type dopants include P, As, or Sb, and the first type dopants include B, In, or Ga. The first epitaxial layer 34 is epitaxial silicon or SiC, and the second epitaxial layer 36 is epitaxial silicon or SiC. Fox example, when the transistor structure 100 is an N-type transistor, the first epitaxial layer 34 is SiC doped with B. The barrier layer 36a is SiC doped with P. The stress layer 36b is SiC doped with P. The cap layer 36c is SiC doped with P. Furthermore, the SiGe and SiC are respectively formed by epitaxial processes rather than any dopant implantation processes. In addition, the first-type dopants and the second-type dopants are introduced into the epitaxial silicon, SiGe and SiC by in-situ processes rather than any dopant implantation processes.

The present invention forms the first epitaxial layer outside of the source/drain doped region (second epitaxial layer). Because the conductive types of the first epitaxial layer and the second epitaxial layer are different, the first epitaxial layer is used to prevent the short channel effect. Conventionally, a pocket dopant region is used to prevent the short channel effect. The pocket dopant region includes doping dopants aside of the source/drain doped region, where the conductive type of the pocket dopant region is different from that of the source/drain doped region. The pocket dopant region is formed by a tilt implantation process. Because the semiconductor device is scaled down and the space between each transistor structure is decreased, the path of the tilt implantation process is blocked by the adjacent transistor structure. Using the first epitaxial layer of the present invention can solve this conventional fabricating problem and prevent the short channel effect as well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a transistor structure, comprising:
   providing a substrate with a doped well disposed within the substrate;
   forming a gate structure disposed on the doped well;
   forming a hexagonal-shaped trench embedded in the doped well at one side of the gate structure;
   forming a first epitaxial layer disposed inside the hexagonal-shaped trench and contacting the hexagonal-shaped trench, wherein the first epitaxial layer comprises first type dopants; and
   forming a second epitaxial layer disposed in the hexagon-shaped trench, wherein the second epitaxial layer comprises second-type dopants, the first epitaxial layer surrounds the second epitaxial layer, the second epitaxial layer serves as a source/drain doped region of the transistor structure, and the first-type dopants and the second-type dopants are different conductive types.

2. The fabricating method of the transistor structure of claim 1, wherein the first epitaxial layer and the second epitaxial layer are formed in the same chamber.

3. The fabricating method of the transistor structure of claim 1, wherein the first-type dopants are introduced into the first epitaxial layer by an in-situ process.

4. The fabricating method of the transistor structure of claim 1, wherein the second-type dopants are introduced into the second epitaxial layer by an in-situ process.

5. The fabricating method of the transistor structure of claim 1, wherein steps of forming the hexagonal-shaped trench comprise:
   forming a trench at one side of the gate structure by an anisotropic etch process; and
   etching the trench to transform the trench into the hexagonal-shaped trench by an isotropic etch process.

6. The fabricating method of the transistor structure of claim 1, wherein the hexagonal-shaped trench has an inclined surface, and a Miller index of the inclined surface is (111).

7. The fabricating method of the transistor structure of claim 1, wherein the first epitaxial layer does not comprise any second-type dopants.

8. The fabricating method of the transistor structure of claim 1, wherein the first epitaxial layer comprises three epitaxial pieces, each of the three epitaxial pieces does not connect to one another, and the three epitaxial pieces are respectively disposed at a bottom of the second epitaxial layer, a right side of the second epitaxial layer and a left side of the second epitaxial layer.

9. The fabricating method of the transistor structure of claim 1, wherein the second epitaxial layer comprises a barrier layer, a stress layer and a cap layer, and the barrier layer, the stress layer and the cap layer comprise the second-type dopants, and the stress layer is disposed between the barrier layer and the cap layer.

10. The fabricating method of the transistor structure of claim 1, wherein part of the first epitaxial layer overlaps the gate structure.

11. The fabricating method of the transistor structure of claim 1, wherein the transistor structure is a P-type transistor, the second-type dopants comprise B, In, or Ga, and the first type dopants comprise P, As, or Sb.

12. The fabricating method of the transistor structure of claim 11, wherein the first epitaxial layer is epitaxial silicon, and the second epitaxial layer is SiGe.

13. The fabricating method of the transistor structure of claim 1, wherein the transistor structure is an N-type transistor, the second-type dopants comprise P, As, or Sb, and the first type dopants comprise B, In, or Ga.

14. The fabricating method of the transistor structure of claim 13, wherein the first epitaxial layer is epitaxial silicon or SiC, and the second epitaxial layer is epitaxial silicon or SiC.

15. The fabricating method of the transistor structure of claim 1, wherein the doped well comprises first-type dopants, and a concentration of first-type dopants in the first epitaxial layer is greater than a concentration of first-type dopants in the doped well.

\* \* \* \* \*